United States Patent
Shiokawa

(10) Patent No.: US 10,762,941 B2
(45) Date of Patent: Sep. 1, 2020

(54) SPIN-ORBIT TORQUE MAGNETIZATION ROTATING ELEMENT, SPIN-ORBIT TORQUE MAGNETORESISTANCE EFFECT ELEMENT, AND MAGNETIC MEMORY

(71) Applicant: TDK CORPORATION, Tokyo (JP)

(72) Inventor: Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/412,541

(22) Filed: May 15, 2019

(65) Prior Publication Data

US 2019/0355401 A1   Nov. 21, 2019

(30) Foreign Application Priority Data

May 16, 2018   (JP) .................................. 2018-094590
May 8, 2019   (JP) .................................. 2019-088326

(51) Int. Cl.
*G11C 11/16* (2006.01)
*H01L 43/10* (2006.01)
(Continued)

(52) U.S. Cl.
CPC .......... *G11C 11/161* (2013.01); *H01L 27/228* (2013.01); *H01L 43/06* (2013.01); *H01L 43/08* (2013.01); *H01L 43/10* (2013.01)

(58) Field of Classification Search
CPC . H01L 25/0657; H01L 25/073; H01L 23/043; H01L 23/053; H01L 23/3738; H01L 24/73; H01L 23/473; H01L 23/481; H01L 2224/29387; H01L 2224/13025; H01L 24/16; H01L 24/13; H01L 2224/32225; H01L 2224/32145; H01L 24/29; H01L 2224/2929;
(Continued)

(56) References Cited

U.S. PATENT DOCUMENTS

| 8,350,347 B2 | 1/2013 | Gaudin et al. |
| 9,343,658 B2 | 5/2016 | Wang et al. |

(Continued)

FOREIGN PATENT DOCUMENTS

| JP | 2014-045196 A | 3/2014 |
| JP | 2017-216286 A | 12/2017 |

(Continued)

OTHER PUBLICATIONS

Fukami, S. et al., "A Spin-Orbit Torque Switching Scheme With Collinear Magnetic Easy Axis and Current Configuration", Nature Nanotechnology, Mar. 21, 2016, DOI:10.1038/NNANO.2016.29.

(Continued)

*Primary Examiner* — Edward Chin
(74) *Attorney, Agent, or Firm* — Oliff PLC

(57) ABSTRACT

A spin-orbit torque magnetization rotating element includes a spin-orbit torque wiring and a laminated body laminated on the spin-orbit torque wiring. The laminated body includes a first ferromagnetic layer independently having an axis of easy magnetization in a first direction, a nonmagnetic antiferromagnetic coupling layer, and a second ferromagnetic layer independently having an axis of easy magnetization in a second direction, in order from the side of the spin-orbit torque wiring, and the first direction crosses the second direction.

17 Claims, 9 Drawing Sheets

(51) Int. Cl.
*H01L 27/22* (2006.01)
*H01L 43/06* (2006.01)
*H01L 43/08* (2006.01)

(58) Field of Classification Search
CPC ........... H01L 2224/16227; H01L 24/33; H01L 2224/83102; H01L 2224/81895; H01L 2924/15153; H01L 2224/73203; H01L 2224/33181; H01L 2224/17181; H01L 2224/16235; H01L 24/83; H01L 2224/73204; H01L 2224/1703; H01L 2224/16146; H01L 2225/06572; H01L 2225/06513; H01L 2224/73253; H01L 24/32; H01L 2224/2919; H01L 2224/29187; H01L 2224/29186; H01L 2224/29188; H01L 2224/29191; H01L 2924/01029; H01L 2224/29147; H01L 2225/06517; H01L 2225/06589; H01L 2225/06541; H01L 24/17
See application file for complete search history.

(56) References Cited

U.S. PATENT DOCUMENTS

| | | | |
|---|---|---|---|
| 2014/0056060 A1* | 2/2014 | Khvalkovskiy | G11C 11/1675 365/158 |
| 2014/0252439 A1 | 9/2014 | Guo | |
| 2014/0312441 A1 | 10/2014 | Guo | |
| 2015/0036415 A1 | 2/2015 | Di Pendina et al. | |
| 2015/0348606 A1* | 12/2015 | Buhrman | G11C 11/1675 365/158 |
| 2017/0222135 A1 | 8/2017 | Fukami et al. | |

FOREIGN PATENT DOCUMENTS

| | | |
|---|---|---|
| WO | 2016/021468 A1 | 2/2016 |
| WO | 2016/159017 A1 | 10/2016 |

OTHER PUBLICATIONS

Kato, Y. K. et al.,"Observation of the Spin Hall Effect in Semiconductors", Science, 306, pp. 1910-1913, (2004), DOI: 10.1126/science.1105514.
Miron, I. M. et al., "Perpendicular Switching of a Single Ferromagnetic Layer Induced by In-Plane Current Injection", Nature, vol. 476, pp. 189-194, (2011).
Liu, L. et al., "Spin Torque Switching With the Giant Spin Hall Effect of Tantalum", Science, 336, 555, (2012).
Liu, L. et al., "Current-Induced Switching of Perpendicularly Magnetized Magnetic Layers Using Spin Torque From the Spin Hall Effect", Physical Review Letters, 109, pp. 096602-1-096602-5, (2012).
Lee, K. S. et al., "Threshold Current for Switching of a Perpendicular Magnetic Layer Induced by Spin Hall Effect", Applied Physics Letters, 102, 112410, (2013).
Lee, K. S. et al., "Thermally Activated Switching of Perpendicular Magnet by Spin-Orbit Spin Torque", Applied Physics Letters, 104, pp. 072413-1-072413-5, (2014).
Fukami, S. et al., "Magnetization Switching by Spin-Orbit Torque in an Antiferromagnet-Ferromagnet Bilayer System", Nature Materials, 15, pp. 535-542, (2016).
Takahashi, S. et al., "Spin Injection and Detection in Magnetic Nanostructures", Physical Review B, 67, pp. 052409-1-052409-4, (2003).
Seo, Y. et al., "Area-Efficient SOT-MRAM With a Schottky Diode", IEEE Electron Device Letters, vol. 37, No. 8, pp. 982-985, 2016.
Zhang, W. et al., "Spin Hall Effects in Metallic Antiferromagnets", Physical Review Letters, 113, pp. 196602-1-196602-6, (2014).

\* cited by examiner

SPIN-ORBIT TORQUE MAGNETIZATION ROTATING ELEMENT, SPIN-ORBIT TORQUE MAGNETORESISTANCE EFFECT ELEMENT, AND MAGNETIC MEMORY

BACKGROUND OF THE INVENTION

Field of the Invention

The present invention relates to a spin-orbit torque magnetization rotating element, a spin-orbit torque magnetoresistance effect element, and a magnetic memory.

Priority is claimed on Japanese Patent Application No. 2018-094590, filed May 16, 2018, and Japanese Patent Application No. 2019-088326, filed May 8, 2019, the content of which is incorporated herein by reference.

Description of Related Art

A giant magnetoresistance (GMR) element made of a multi-layer film including a ferromagnetic layer and a nonmagnetic layer and a tunneling magnetoresistance (TMR) element using an insulating layer (tunnel barrier layer, barrier layer) as a nonmagnetic layer are known. These have been focused on as elements for a magnetic sensor, a high-frequency component, a magnetic head and a nonvolatile random access memory (MRAM).

The MRAM reads and writes data using a characteristic in which, when directions of magnetizations of two ferromagnetic layers with an insulating layer therebetween change, the element resistance of a GMR element or a TMR element changes. Regarding a writing method for a MRAM, a method in which writing (magnetization reversal) is performed using a magnetic field generated by a current and a method in which writing (magnetization reversal) is performed using a spin transfer torque (STT) generated when a current flows in a lamination direction of magnetoresistance effect elements are known.

In the magnetization reversal of a magnetoresistance effect element using an STT, it is necessary to cause a current to flow in a lamination direction of magnetoresistance effect elements when data is written. A write current may deteriorate characteristics of the magnetoresistance effect element.

In recent years, methods in which there is no need to cause a current to flow in a lamination direction of magnetoresistance effect elements during writing have thus been focused upon. One of the methods is a writing method using a spin-orbit torque (SOT) (for example, Japanese Unexamined Patent Application, First Publication No. 2017-216286). An SOT is induced by a pure spin current that is generated by a spin-orbit interaction or the Rashba effect at an interface between different materials. A current for inducing an SOT in a magnetoresistance effect element flows in a direction crossing the lamination direction of magnetoresistance effect elements. That is, there is no need to cause a current to flow in a lamination direction of magnetoresistance effect elements, and a longer lifespan for magnetoresistance effect elements can be expected.

On the other hand, in the case of magnetization reversal using an SOT, depending on the configuration of the element, it may be necessary to assist magnetization reversal due to an external magnetic field (for example, S. Fukami, T. Anekawa, C. Zhang, and H. Ohno, Nature Nanotechnology, DOI:10.1038/NNANO.2016.29.). In order to apply an external magnetic field, a generation source for an external magnetic field is necessary.

For example, in U.S. Pat. No. 9,343,658, it is described that the symmetry of the strength of the magnetization is broken by changing an oxygen content in an oxide film bonded to a ferromagnetic material with magnetization reversal. When the symmetry of the strength of the magnetization is broken, the magnetization easily rotates and magnetization reversal using an SOT is possible even if there is no magnetic field.

SUMMARY OF THE INVENTION

When a generation source for an external magnetic field is separately provided, this leads to an increase in the size of the element and complication of processing processes. Depending on the configuration of the element, magnetization reversal can be performed without applying an external magnetic field, but there is a problem that it takes a time for magnetization reversal.

In addition, in the method described in U.S. Pat. No. 9,343,658, the symmetry of the strength of the magnetization is broken when some magnetic anisotropy weakens. There is a problem that the thermal stability deteriorates when the magnetic anisotropy weakens.

The present invention has been made in view of the above problems and an object of the present invention is to provide a spin-orbit torque magnetization rotating element that can invert the direction of magnetization even under conditions in which no external magnetic field is applied.

The inventors conducted extensive studies, and as a result, found that the symmetry of the magnetization can be broken and an orientation direction of the magnetization can be inclined while maintaining the strength of the magnetic anisotropy.

Specifically, the present invention provides the following aspects in order to address the above problems.

(1) A spin-orbit torque magnetization rotating element according to a first aspect includes a spin-orbit torque wiring; and a laminated body laminated on the spin-orbit torque wiring, wherein the laminated body includes a first ferromagnetic layer independently having an axis of easy magnetization in a first direction, a nonmagnetic antiferromagnetic coupling layer, and a second ferromagnetic layer independently having an axis of easy magnetization in a second direction, in order from the side of the spin-orbit torque wiring, and wherein the first direction crosses the second direction.

(2) In the spin-orbit torque magnetization rotating element according to the above aspect, the first direction may be orthogonal to the second direction (3) In the spin-orbit torque magnetization rotating element according to the above aspect, the first direction may be an in-plane direction of the laminated body, and the second direction may be an orthogonal direction of the laminated body.

(4) In the spin-orbit torque magnetization rotating element according to the above aspect, the first direction may be an orthogonal direction of the laminated body, and the second direction may be an in-plane direction of the laminated body.

(5) In the spin-orbit torque magnetization rotating element according to the above aspect, the second ferromagnetic layer may contain Fe.

(6) In the spin-orbit torque magnetization rotating element according to the above aspect, the first ferromagnetic layer may contain Co.

(7) In the spin-orbit torque magnetization rotating element according to the above aspect, a film thickness of a ferromagnetic layer having an axis of easy magnetization in an orthogonal direction among the first ferromagnetic layer and the second ferromagnetic layer may be thinner than the film thickness of a ferromagnetic layer having an axis of easy magnetization in an in-plane direction.

(8) In the spin-orbit torque magnetization rotating element according to the above aspect, a film thickness of the second ferromagnetic layer may be thicker than a film thickness of the first ferromagnetic layer.

(9) In the spin-orbit torque magnetization rotating element according to the above aspect, the nonmagnetic antiferromagnetic coupling layer may contain at least one selected from a group consisting of Ru, Ir, and Rh.

(10) In the spin-orbit torque magnetization rotating element according to the above aspect, the laminated body may be circular in a plan view.

(11) In the spin-orbit torque magnetization rotating element according to the above aspect, the laminated body in a plan view may have shape anisotropy with a major axis and a minor axis.

(12) A spin-orbit torque magnetoresistance effect element according to a second aspect includes the spin-orbit torque magnetization rotating element according to the above aspect, a nonmagnetic layer laminated on a side opposite to the spin-orbit torque wiring of the laminated body; and a third ferromagnetic layer with the laminated body and the nonmagnetic layer therebetween.

(13) In the spin-orbit torque magnetoresistance effect element according to the above aspect, magnetic anisotropy of a ferromagnetic layer having an axis of easy magnetization in a same direction as the third ferromagnetic layer among the first ferromagnetic layer and the second ferromagnetic layer is stronger than magnetic anisotropy of a ferromagnetic layer having an axis of easy magnetization in a different direction as the third ferromagnetic layer.

(14) A magnetic memory according to a third aspect includes a plurality of spin-orbit torque magnetoresistance effect elements according to the above aspect.

In the spin-orbit torque magnetization rotating element, the spin-orbit torque magnetoresistance effect element, and the magnetic memory according to the above aspects, the direction of magnetization can be inverted even if no external magnetic field is applied.

DETAILED DESCRIPTION OF THE INVENTION

Figure 1:
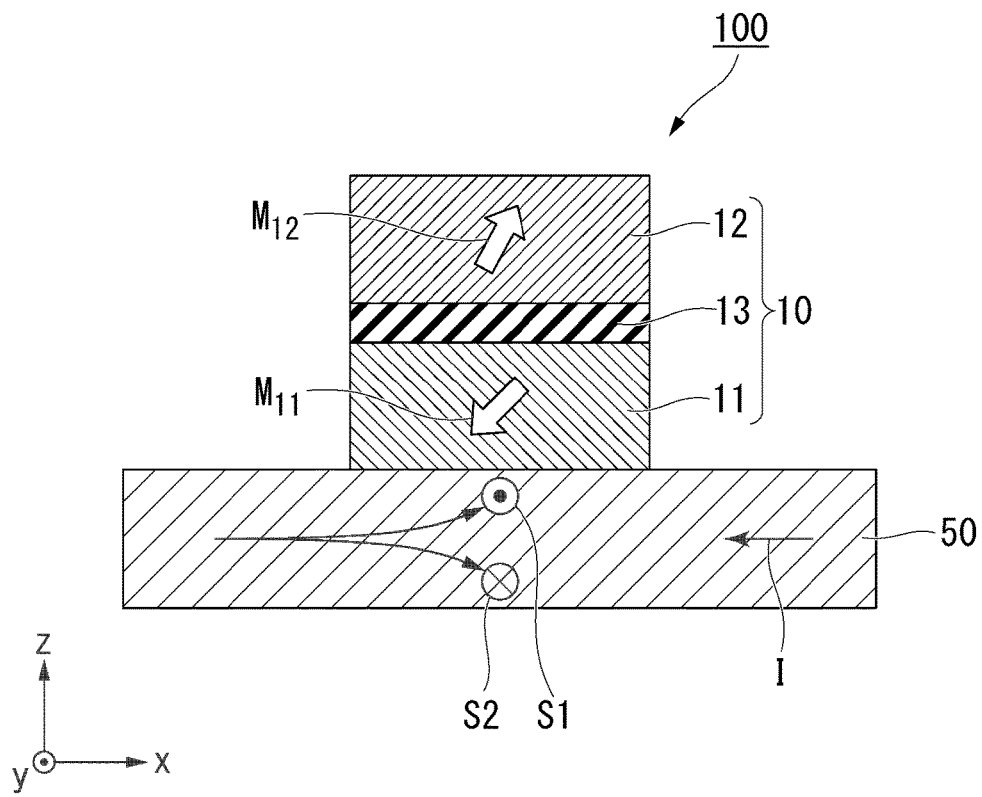
FIG. 1 is a cross-sectional view schematically showing a spin-orbit torque magnetization rotating element according to a first embodiment.

The present embodiment will be appropriately described below in detail with reference to the drawings. In the drawings used in the following description, in order to facilitate understanding of features of the present invention, feature parts are enlarged for convenience of illustration in some cases, and size ratios and the like between components may be different from actual components. Materials, sizes, and the like exemplified in the following description are examples not liming the present invention, and they can be appropriately changed within a range in which effects of the present invention are obtained.

(Spin-orbit Torque Magnetization Rotating Element)

"First Embodiment"

FIG. 1 is a cross-sectional view schematically showing a spin-orbit torque magnetization rotating element according to a first embodiment. A spin-orbit torque magnetization rotating element 100 shown in FIG. 1 includes a laminated body 10 and a spin-orbit torque wiring 50.

Hereinafter, a direction in which the spin-orbit torque wiring extends will be referred to as an x direction, a lamination direction of the laminated body 10 will be referred to as a z direction, and a direction orthogonal to the x direction and the z direction will be referred to as a y direction.

<Laminate 10>

The laminated body 10 is laminated on one surface of the spin-orbit torque wiring 50. The laminated body 10 includes a first ferromagnetic layer 11, a nonmagnetic antiferromagnetic coupling layer 13, and a second ferromagnetic layer 12 from the side of the spin-orbit torque wiring 50.

Figure 2:
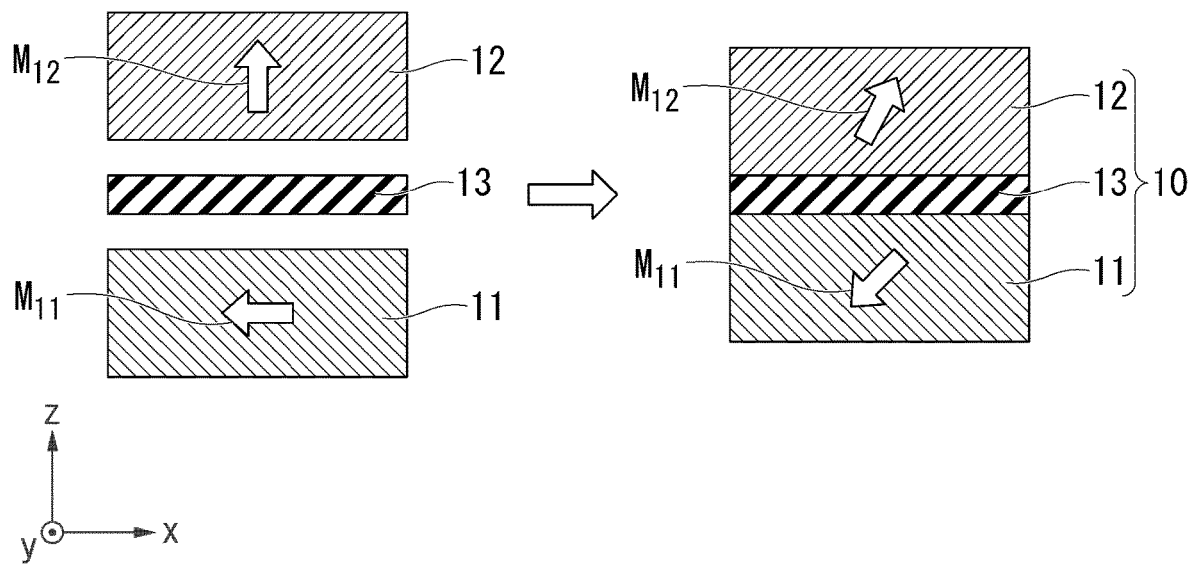
FIG. 2 is a diagram schematically showing a magnetization state of a laminated body of the spin-orbit torque magnetization rotating element according to the first embodiment.

FIG. 2 is a diagram schematically showing a magnetization state of the laminated body 10 of the spin-orbit torque magnetization rotating element 100 according to the first embodiment. As shown in FIG. 2, the first ferromagnetic layer 11 has independently an axis of easy magnetization in a first direction, and the second ferromagnetic layer 12 has independently an axis of easy magnetization in a second direction. The first direction and the second direction cross each other and are preferably orthogonal to each other. "Independently" refers to a state before lamination with other layers. In addition, the axis of easy magnetization refers to a main crystal orientation in which magnetization easily occurs in a magnetic material.

In the example shown in FIG. 2, the axis of easy magnetization of the first ferromagnetic layer 11 independently is an in-plane direction of the lamination surface of the laminated body 10, and the axis of easy magnetization of the second ferromagnetic layer 12 independently is an orthogonal direction (lamination direction) of the lamination surface of the laminated body 10. That is, in the example in FIG. 2, the first direction is an in-plane direction, and the second direction is an orthogonal direction.

The first ferromagnetic layer 11 and the second ferromagnetic layer 12 in the laminated body 10 do not exist by itself, but are laminated in close proximity via the nonmagnetic antiferromagnetic coupling layer 13. A magnetization $M_{11}$ of the first ferromagnetic layer 11 and a magnetization $M_{12}$ of the second ferromagnetic layer 12 are antiferromagnetically coupled by being brought close to each other via the nonmagnetic antiferromagnetic coupling layer 13.

As a result, the magnetization $M_{11}$ of the first ferromagnetic layer 11 oriented in the in-plane direction independently is inclined in the orthogonal direction, and the magnetization $M_{12}$ of the second ferromagnetic layer 12 oriented in the orthogonal direction independently is inclined in the in-plane direction. That is, the magnetizations $M_{11}$ and $M_{12}$ of the first ferromagnetic layer 11 and the second ferromagnetic layer 12 when incorporated in the laminated body 10 are inclined from the in-plane direction and the orthogonal direction. Inclination angles of the magnetization $M_{11}$ of the first ferromagnetic layer 11 and the magnetization $M_{12}$ of the second ferromagnetic layer 12 with respect to the in-plane direction are, for example, different from each other. The magnetization $M_{11}$ of the first ferromagnetic layer 11 is inclined, for example, at an angle of 0° or more and less than 45° with respect to the in-plane direction. The magnetization $M_{12}$ of the second ferromagnetic layer 12 is inclined, for example, at an angle of 45° or more and less than 90° with respect to the in-plane direction.

A ferromagnetic material, and particularly, a soft magnetic material can be applied to the first ferromagnetic layer 11 and the second ferromagnetic layer 12. For example, a metal selected from a group consisting of Cr, Mn, Co, Fe and Ni, alloys containing one or more of such a metal, alloys containing such a metal and at least one element of B, C, and N and the like can be used. Specifically, Co—Fe, Co—Fe—B, Ni—Fe, and Co—Ho alloys (CoHo$_2$), Sm—Fe alloys (SmFe$_{12}$), and the like may be exemplified.

Although it differs depending on the film thickness of the ferromagnetic layer, when Co—Fe, Co—Fe—B, or Ni—Fe is used, the axis of easy magnetization tends to be perpendicular to the plane, and when a Co—Ho alloy (CoHo$_2$) or an Sm—Fe alloy (SmFe$_{12}$) is used, the axis of easy magnetization tends to be in the in-plane direction.

In the example in FIG. 2, the second ferromagnetic layer 12 preferably contains Fe. When an oxide film is laminated on the surface opposite to the nonmagnetic antiferromagnetic coupling layer 13 of the second ferromagnetic layer 12, magnetic anisotropy of the magnetization Mie of the second ferromagnetic layer 12 in the orthogonal direction can be strengthened with an Fe—O bond.

In addition, in the example in FIG. 2, the film thickness of the second ferromagnetic layer 12 is preferably thinner than the film thickness of the first ferromagnetic layer 11. When the film thickness is thin, the influence of a lamination interface is more strongly received, and magnetic anisotropy of the magnetization $M_{12}$ of the second ferromagnetic layer 12 in the orthogonal direction is strengthened.

A Heusler alloy such as Co$_2$FeSi can be used for the first ferromagnetic layer 11 and the second ferromagnetic layer 12. A Heusler alloy contains an intermetallic compound having a chemical composition of XYZ or X$_2$YZ. In the periodic table, X is a transition metal element from the Co, Fe, Ni, or Cu groups or a noble metal element, Y is a transition metal from the Mn, V, Cr or Ti groups or an element of type X, and Z is a typical element from Group III to Group V. Examples of Heusler alloys include Co$_2$FeSi, Co$_2$FeGe, Co$_2$FeGa, Co$_2$MnSi, Co$_2$Mn$_{1-a}$Fe$_a$Al$_b$Si$_{1-b}$, and Co$_2$FeGe$_{1-c}$Ga$_c$.

The nonmagnetic antiferromagnetic coupling layer 13 is positioned among the first ferromagnetic layer 11 and the second ferromagnetic layer 12. The nonmagnetic antiferromagnetic coupling layer 13 is nonmagnetic. The magnetization $M_{11}$ of the first ferromagnetic layer 11 and the magnetization $M_{12}$ of the second ferromagnetic layer 12 are antiferromagnetically coupled with the nonmagnetic antiferromagnetic coupling layer 13 therebetween. Whether the magnetization $M_{11}$ of the first ferromagnetic layer 11 and the magnetization $M_{12}$ of the second ferromagnetic layer 12 are antiferromagnetically coupled can be controlled by a material, the film thickness, and the like of the nonmagnetic antiferromagnetic coupling layer 13. The film thickness of the nonmagnetic antiferromagnetic coupling layer 13 is preferably 3 Å to 10 Å depending on the material used.

The nonmagnetic antiferromagnetic coupling layer 13 preferably contains at least one selected from a group consisting of Ru, Ir, and Rh. Such elements have many spins and a large spin-orbit interaction, and thus they strongly exert on the magnetizations $M_{11}$ and $M_{12}$ of two adjacent ferromagnetic layers (the first ferromagnetic layer 11 and the second ferromagnetic layer 12), and the magnetization $M_{11}$ and the magnetization $M_{12}$ are strongly antiferromagnetically coupled.

<Spin-orbit Torque Wiring>

The spin-orbit torque wiring 50 extends in the x direction. The spin-orbit torque wiring 50 is connected to one surface of the laminated body 10 in the z direction. Preferably, the spin-orbit torque wiring 50 is directly connected to the laminated body 10.

The spin-orbit torque wiring 50 is made of a material in which a spin current is generated due to a spin Hall effect when a current flows. As such a material, a material having a configuration in which a spin current is generated in the spin-orbit torque wiring 50 is sufficient. Therefore, the spin-orbit torque wiring 50 is not limited to that made of a material including a single element, and it may include a part made of a material in which a spin current is easily generated and a part made of a material in which a spin current is unlikely to be generated.

The spin Hall effect is a phenomenon in which, when a current flows through a material, a spin current is induced in a direction orthogonal to a direction of the current based on a spin-orbit interaction. A mechanism in which a spin current is generated due to the spin Hall effect will be described.

When a potential difference is provided at both ends of the spin-orbit torque wiring 50, a current flows through the spin-orbit torque wiring 50. When a current flows, a first spin S1 directed in one direction and a second spin S2 directed in a direction opposite to the first spin S1 are bent in directions orthogonal to the current. For example, the first spin S1 is bent in the z direction with respect to a direction of travel, and the second spin S2 is bent in the −z direction with respect to a direction of travel.

The general Hall effect and the spin Hall effect are the same in that mobile (moving) charges (electrons) are bent in the direction of motion (movement). On the other hand, the general Hall effect and the spin Hall effect are greatly different in that charged particles that move in a magnetic field receive a Lorentz force and are bent in a movement direction in the general Hall effect, but a movement direction of a spin is bent only by movement of electrons (only when a current flows) without there being a magnetic field in the spin Hall effect.

Since the number of electrons with the first spin S1 and the number of electrons with the second spin S2 are the same in a nonmagnetic material (a material that is not a ferromagnetic material), the number of electrons with the first spin S1 in the +z direction and the number of electrons with the second spin S2 in the −z direction are the same in the drawing. In this case, flows of charges are canceled out each other, and an amount of currents becomes zero. A spin current that occurs without this current is specifically called a pure spin current.

When a flow of electrons with the first spin S1 is denoted as $J_\uparrow$, and a flow of electrons with the second spin S2 is denoted as $J_\downarrow$, and a spin current is denoted as $J_S$, $J_S=J_\uparrow-J_\downarrow$ is defined. The spin current $J_S$ flows in the z direction in the drawing. In FIG. 1, on the upper surface of the spin-orbit torque wiring 50, the first ferromagnetic layer 11 to be described below is provided. Therefore, spins are injected into the first ferromagnetic layer 11.

The spin-orbit torque wiring 50 is made of any of a metal, an alloy, an intermetallic compound, a metal boride, a metal carbide, a metal silicide, and a metal phosphide which have a function of generating a spin current due to the spin Hall effect when a current flows.

The main configuration of the spin-orbit torque wiring 50 is preferably a nonmagnetic heavy metal. Here, a heavy metal refers to a metal having a specific gravity that is equal to or higher than that of yttrium. The nonmagnetic heavy metal is preferably a nonmagnetic metal including d electrons or f electrons in the outmost shell and having a large atomic number of 39 or more. Such a nonmagnetic metal has a strong spin-orbit interaction causing the spin Hall effect.

Generally, electrons move in a direction opposite to the current irrespective of the direction of the spin. On the other hand, a nonmagnetic metal including d electrons or f electrons in the outermost shell and having a large atomic number has a strong spin-orbit interaction and the spin Hall effect strongly exhibits. Therefore, a direction of movement of electrons depends on a direction of the spin of the electrons. Accordingly, a spin current $J_S$ is likely to be generated in such a nonmagnetic heavy metal.

In addition, the spin-orbit torque wiring 50 may contain a magnetic metal. The magnetic metal refers to a ferromagnetic metal or an antiferromagnetic metal. When a small amount of a magnetic metal is contained in the nonmagnetic metal, this serves as a spin scattering factor. When spins are scattered, the spin-orbit interaction is enhanced and the spin current generation efficiency for a current increases. The main configuration of the spin-orbit torque wiring 50 may be only an antiferromagnetic metal.

On the other hand, when an amount of a magnetic metal added is too large, a generated spin current is scattered by the added magnetic metal, and as a result, an effect of decreasing a spin current may be strong. Therefore, preferably, a molar ratio of the added magnetic metal is sufficiently smaller than a total molar ratio of elements constituting the spin-orbit torque wiring. A molar ratio of the added magnetic metal is preferably 3% or less with respect to the whole.

The spin-orbit torque wiring 50 may contain a topological insulator. A topological insulator is a substance which includes an insulator or a high resistance component therein and has a surface in a spin-polarized metallic state. In this substance, an internal magnetic field is generated due to a spin-orbit interaction. Therefore, a new topological phase is exhibited due to an effect of the spin-orbit interaction even if there is no external magnetic field. This is a topological insulator, and a pure spin current can be generated with high efficiency due to a strong spin-orbit interaction and breaking of inversion symmetry at the edge.

Preferably, the topological insulator is made of, for example, SnTe, $Bi_{1.5}Sb_{0.5}Te_{1.7}Se_{1.3}$, $TlBiSe_2$, $Bi_2Te_3$, $Bi_{1-x}Sb_x$, or $(Bi_{1-x}Sb_x)_2Te_3$. Such topological insulators can generate a spin current with high efficiency.

Regarding one aspect of the shape of the laminated body 10 in a plan view, a circle can be selected. If the shape of the laminated body 10 in a plan view is a circle, accumulation easily occurs, and accumulation properties can be improved.

Regarding another aspect of the shape of the laminated body 10 in a plan view, a shape having shape anisotropy with a major axis and a minor axis can be selected. Examples of the shape having shape anisotropy with a major axis and a minor axis include a rectangle and an ellipse.

When the shape of the laminated body 10 in a plan view has shape anisotropy, the magnetizations $M_{11}$ and $M_{12}$ of the first ferromagnetic layer 11 and the second ferromagnetic layer 12 can be easily oriented in the major axis direction.

When high-speed magnetization reversal is required, the extension direction of the spin-orbit torque wiring 50 is made to coincide with the major axis direction. Since the direction of the first spin S1 injected from the spin-orbit torque wiring 50 and an orientation direction (oriented in the major axis direction) of the magnetizations $M_{11}$ and $M_{12}$ are orthogonal to each other, the magnetizations $M_{11}$ and $M_{12}$ are inverted at a high speed.

When a reduction in the inversion current density is required, the extension direction of the spin-orbit torque wiring 50 is made to orthogonal to the major axis direction. Since the direction of the first spin S1 injected from the spin-orbit torque wiring 50 and the orientation direction (oriented in the major axis direction) of the magnetizations $M_{11}$ and $M_{12}$ match, a large torque can be applied to the magnetizations $M_{11}$ and $M_{12}$, and the inversion current density can be reduced.

When both high-speed magnetization reversal and a reduction in the inversion current density are required, the major axis direction is inclined with respect to the extension direction of the spin-orbit torque wiring 50.

Figure 3:
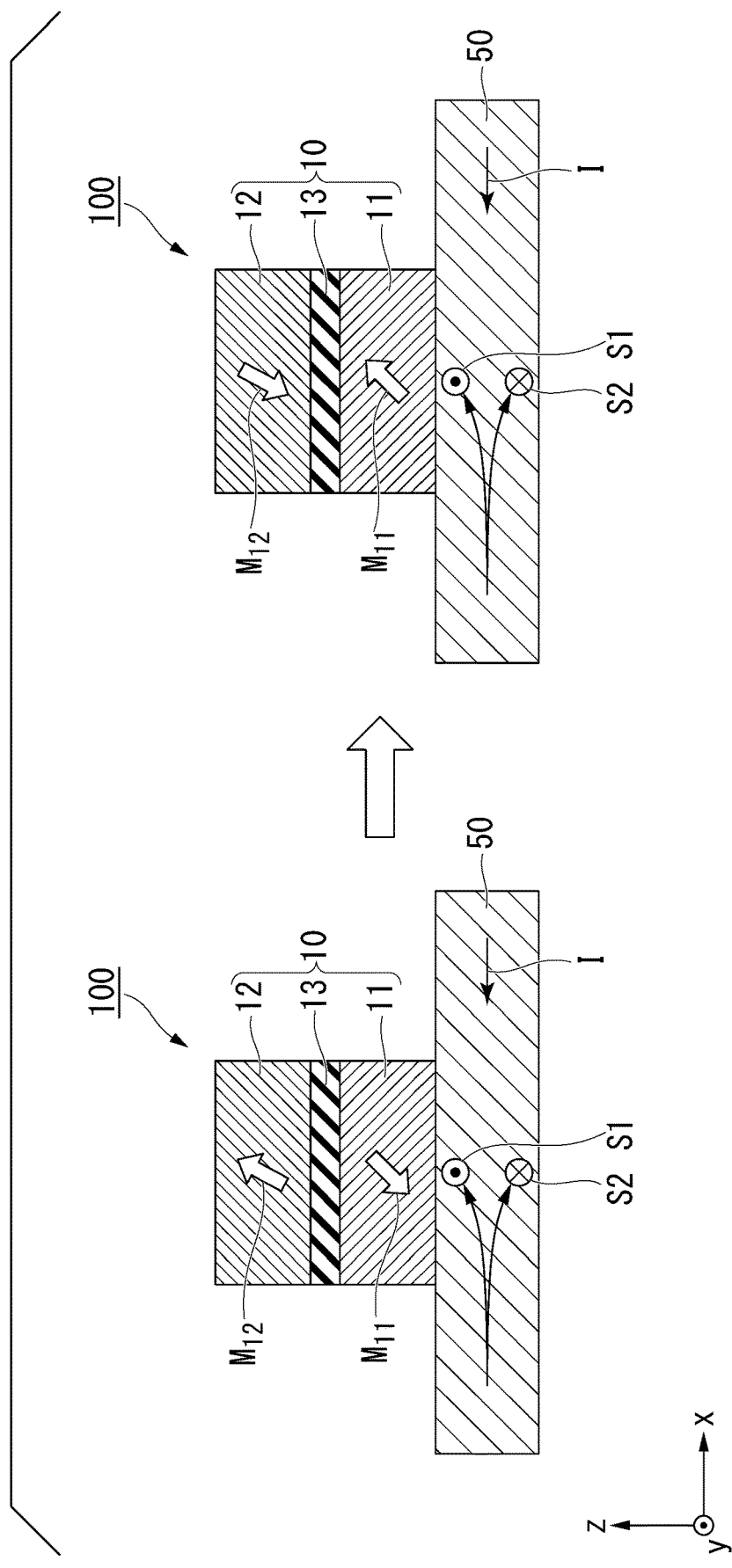
FIG. 3 is a schematic view for explaining the operation of the spin-orbit torque magnetization rotating element according to the first embodiment.

Next, the principle of the spin-orbit torque magnetization rotating element 100 will be described. In addition, the reason why the spin-orbit torque magnetization rotating element 100 according to the present embodiment can reverse the magnetization without application of an external magnetic field will be described. FIG. 3 is a schematic view for explaining the operation of the spin-orbit torque magnetization rotating element 100.

When a write current I flows through the spin-orbit torque wiring 50, a spin Hall effect occurs. The first spin S1 bent in the z direction is oriented in a direction orthogonal to the write current I. The first ferromagnetic layer 11 is disposed in the z direction of the spin-orbit torque wiring 50. Therefore, spins are injected from the spin-orbit torque wiring 50 to the first ferromagnetic layer 11. The injected spins provide a spin-orbit torque (SOT) to the magnetization $M_{11}$ of the first ferromagnetic layer 11.

The axis of easy magnetization of the first ferromagnetic layer 11 independently is in the in-plane direction (x direction). When incorporated into the laminated body 10, the magnetization $M_{11}$ of the first ferromagnetic layer 11 receives a force oriented to the axis of easy magnetization specific to the first ferromagnetic layer 11 and a force applied from the magnetization $M_{12}$ of the second ferromagnetic layer 12 and is inclined from the direction of the specific axis of easy magnetization. That is, the magnetization $M_{11}$ of the first ferromagnetic layer 11 receives a force applied from the magnetization $M_{12}$ of the second ferromagnetic layer 12, and transitions from a stable state (symmetrical state) including two states in the direction of the axis of easy magnetization and the direction of the axis of hard magnetization to a state that can be brought into a complex stable state (the symmetry is broken).

The first spin S1 directed in the y direction is injected into the first ferromagnetic layer 11, and thus provides a torque rotating the magnetization $M_{11}$ 90° toward the y direction.

When the symmetry of the magnetization $M_{11}$ of the first ferromagnetic layer 11 is not broken (when the magnetization $M_{11}$ of the first ferromagnetic layer 11 is oriented in the x direction), a probability of the magnetization $M_{11}$ rotated 90° returning to an original state and a probability of the magnetization $M_{11}$ being inverted are almost the same. Therefore, stable inversion is not possible unless the symmetry of the magnetization $M_{11}$ is broken by applying an external magnetic field or the like.

On the other hand, when the symmetry of the magnetization $M_{11}$ of the first ferromagnetic layer 11 is broken, the probability of the magnetization $M_{11}$ rotated 90° returning to an original state and the probability of the magnetization $M_{11}$ being inverted do not become symmetrical. When the probability of the magnetization $M_{11}$ being inverted is made higher than the probability of the magnetization $M_{11}$ being returned to an original state, even if an external magnetic field is not applied, the magnetization $M_{11}$ is stably inverted. Although not an exact description, the following image is provided for ease of understanding. For example, in order to make the magnetization $M_{11}$ inclined in the −xz direction be oriented in the y direction, a torque in the z direction is applied. Even after the magnetization $M_{11}$ is oriented in the y direction, a torque in the z direction is applied to the magnetization $M_{11}$ according to the law of inertia. That is, the magnetization $M_{11}$ is more easily brought into a state in which it is inverted (the right in FIG. 3) than a state in which it is returned to an original state (the left in FIG. 3), and the magnetization $M_{11}$ is stably inverted.

The first ferromagnetic layer 11 and the second ferromagnetic layer 12 are antiferromagnetically coupled. When the magnetization $M_{11}$ of the first ferromagnetic layer 11 is inverted, the magnetization $M_{12}$ of the second ferromagnetic layer 12 is also inverted.

As described above, in the spin-orbit torque magnetization rotating element 100 according to the first embodiment, the magnetization $M_{11}$ of the first ferromagnetic layer 11 is inclined with respect to the injected first spin S1. Therefore, the symmetry of the magnetization $M_{11}$ of the first ferromagnetic layer 11 with respect to the injected first spin S1 is broken. As a result, the magnetization of the spin-orbit torque magnetization rotating element 100 according to the first embodiment can easily be inverted even if no magnetic field is applied from the outside of the element.

In addition, the orientation direction of the magnetization $M_{11}$ of the first ferromagnetic layer 11 is more inclined than that of the magnetization $M_{12}$ of the second ferromagnetic layer 12, but the strength of magnetic anisotropy of the first ferromagnetic layer 11 itself does not necessarily change. Therefore, the thermal stability of the first ferromagnetic layer 11 is high and the spin-orbit torque magnetization rotating element 100 having excellent thermal stability can be realized.

The spin-orbit torque magnetization rotating element 100 according to the first embodiment can be produced using a film forming method such as sputtering and a processing method such as photolithography. The directions of the axes of easy magnetization of the magnetization $M_{11}$ of the first ferromagnetic layer 11 and the magnetization $M_{12}$ of the second ferromagnetic layer 12 can be defined by controlling materials constituting them and the film thickness.

"Second Embodiment"

Figure 4:
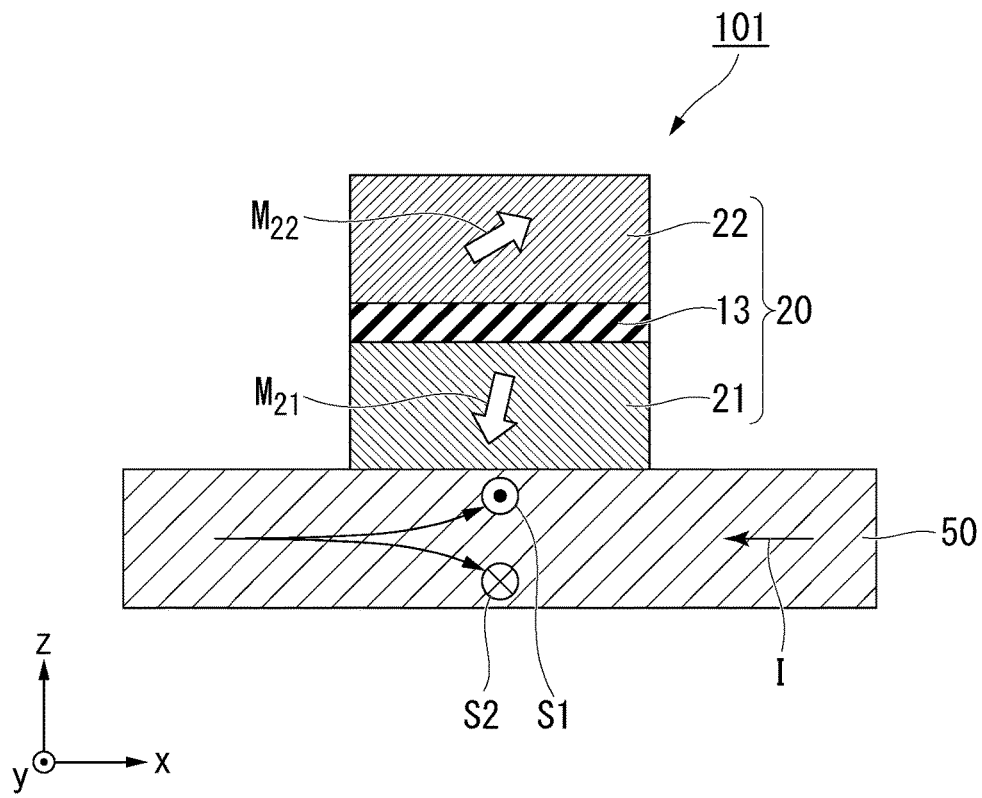
FIG. 4 is a cross-sectional view schematically showing a spin-orbit torque magnetization rotating element according to a second embodiment.

FIG. 4 is a cross-sectional view schematically showing a spin-orbit torque magnetization rotating element according to a second embodiment. A spin-orbit torque magnetization rotating element 101 shown in FIG. 4 includes a laminated body 20 and a spin-orbit torque wiring 50. The spin-orbit torque magnetization rotating element 101 shown in FIG. 4 is different from the spin-orbit torque magnetization rotating element 100 according to the first embodiment in that orientation directions of magnetizations $M_{21}$ and $M_{22}$ of a first ferromagnetic layer 21 and a second ferromagnetic layer 22 are different. The other components are the same and the same components are denoted with the same reference numerals.

The laminated body 20 includes the first ferromagnetic layer 21, the nonmagnetic antiferromagnetic coupling layer 13, and the second ferromagnetic layer 22 from the side of the spin-orbit torque wiring 50.

Figure 5:
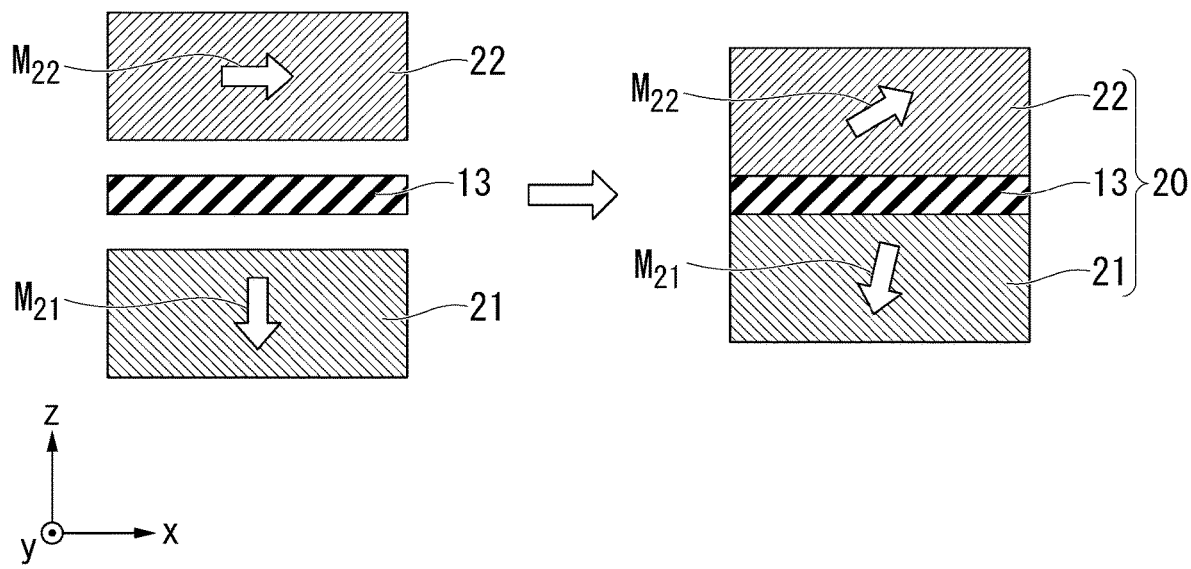
FIG. 5 is a diagram schematically showing a magnetization state of a laminated body of the spin-orbit torque magnetization rotating element according to the second embodiment.

FIG. 5 is a diagram schematically showing a magnetization state of the laminated body 20 of the spin-orbit torque magnetization rotating element 101 according to the second embodiment. In the example shown in FIG. 5, the axis of easy magnetization of the first ferromagnetic layer 21 independently is in the orthogonal direction of the lamination surface of the laminated body 10, and the axis of easy magnetization of the second ferromagnetic layer 22 independently is in the in-plane direction of the lamination surface of the laminated body 10. That is, in the example in FIG. 5, the first direction is an orthogonal direction, and the second direction is the in-plane direction.

The magnetization $M_{21}$ of the first ferromagnetic layer 21 and the magnetization $M_{22}$ of the second ferromagnetic layer 22 are antiferromagnetically coupled by being brought close to each other via the nonmagnetic antiferromagnetic coupling layer 13. As a result, the magnetization $M_{21}$ of the first ferromagnetic layer 21 independently oriented in the orthogonal direction is inclined toward the in-plane direction, and the magnetization $M_{22}$ of the second ferromagnetic layer 22 independently oriented in the in-plane direction is inclined toward the orthogonal direction. That is, the magnetizations $M_{21}$ and $M_{22}$ of the first ferromagnetic layer 21 and the second ferromagnetic layer 22 when incorporated into the laminated body 20 are inclined from the in-plane direction and the orthogonal direction. Inclination angles of the magnetization $M_{21}$ of the first ferromagnetic layer 21 and the magnetization $M_{22}$ of the second ferromagnetic layer 22 with respect to the in-plane direction are, for example, different from each other. The magnetization $M_{21}$ of the first ferromagnetic layer 21 is inclined, for example, at an angle of 45° or more and less than 90° with respect to the in-plane direction. The magnetization $M_{22}$ of the second ferromagnetic layer 22 is inclined, for example, at an angle of 0° or more and less than 45° with respect to the in-plane direction.

In the example in FIG. 5, the first ferromagnetic layer 21 preferably contains Co. The magnetization $M_{21}$ of the first ferromagnetic layer 21 receives the influence of interface magnetic anisotropy with the spin-orbit torque wiring 50 and is oriented in the orthogonal direction (vertical direction).

The interface magnetic anisotropy is strengthened due to a heavy metal and Co in the spin-orbit torque wiring 50.

In addition, in the example in FIG. 5, the film thickness of the first ferromagnetic layer 21 is preferably thinner than the film thickness of the second ferromagnetic layer 22. When the film thickness is thin, the influence of the lamination interface is more strongly received, and magnetic anisotropy of the magnetization $M_{21}$ of the first ferromagnetic layer 21 in the orthogonal direction is strengthened.

Figure 6:
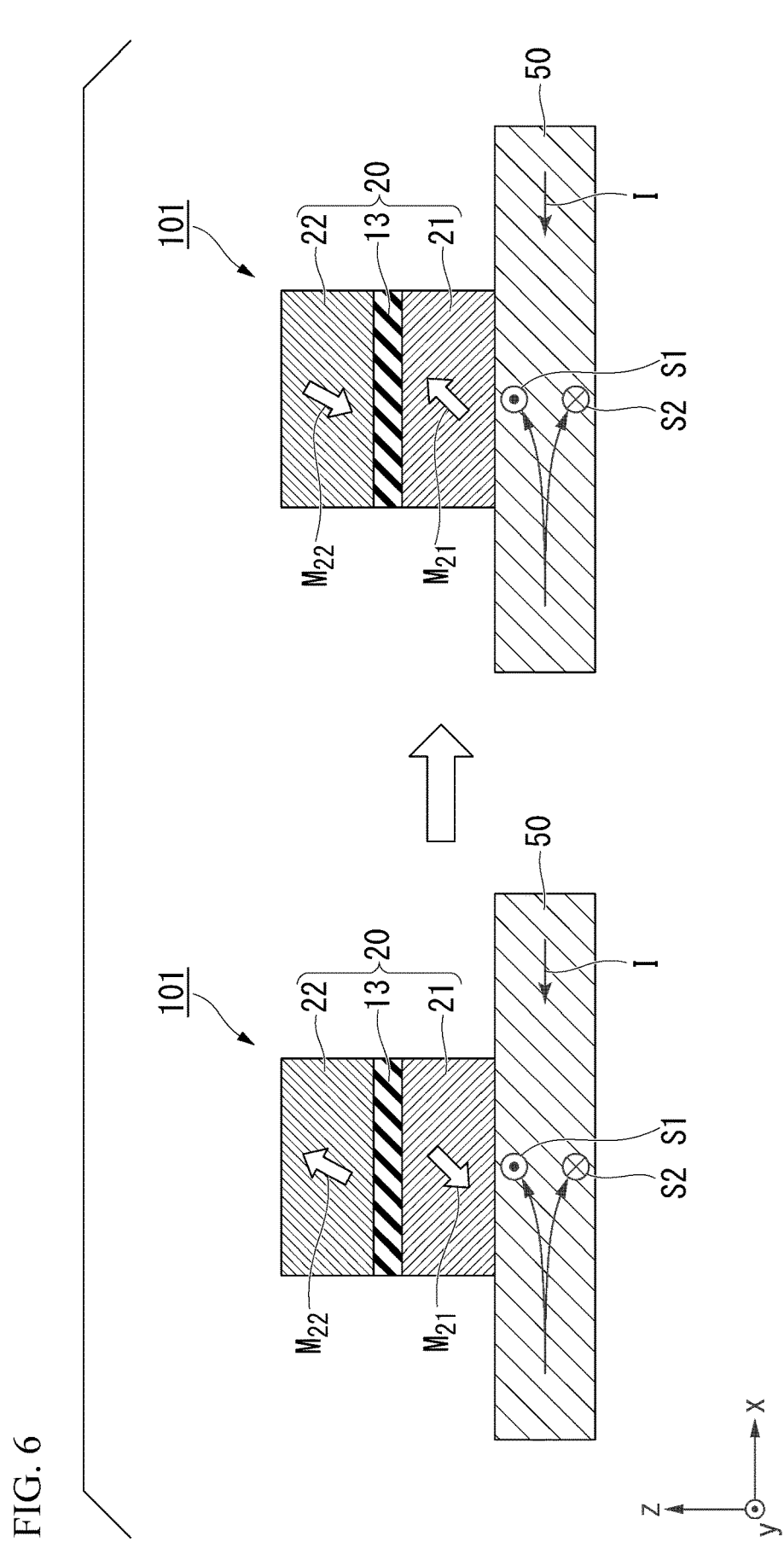
FIG. 6 is a schematic view for explaining the operation of the spin-orbit torque magnetization rotating element according to the second embodiment.

FIG. 6 is a schematic view for explaining the operation of the spin-orbit torque magnetization rotating element 101. The operation of the spin-orbit torque magnetization rotating element 101 is the same as that of the spin-orbit torque magnetization rotating element 100 according to the first embodiment.

The magnetization $M_{21}$ of the first ferromagnetic layer 21 receives a force oriented to the axis of easy magnetization specific to the first ferromagnetic layer 21 and a force applied from the magnetization $M_{22}$ of the second ferromagnetic layer 22 and is inclined from the direction of the specific axis of easy magnetization. That is, the magnetization $M_{21}$ of the first ferromagnetic layer 21 is inclined with respect to the injected first spin S1. Therefore, the symmetry of the magnetization $M_{21}$ of the first ferromagnetic layer 21 with respect to the injected first spin S1 is broken.

As in the first embodiment, the magnetization of the spin-orbit torque magnetization rotating element 101 according to the second embodiment can easily be inverted even if no magnetic field is applied from the outside of the element. In addition, the spin-orbit torque magnetization rotating element 101 according to the second embodiment has excellent thermal stability.

While the first embodiment and the second embodiment have been described above in detail with reference to the drawings, respective configurations in the embodiments, combinations thereof, and the like are only examples, and additions, omissions, substitutions, and other modifications of the configuration can be made without departing from the scope of the present invention.

"First Modified Example"

Figure 7:
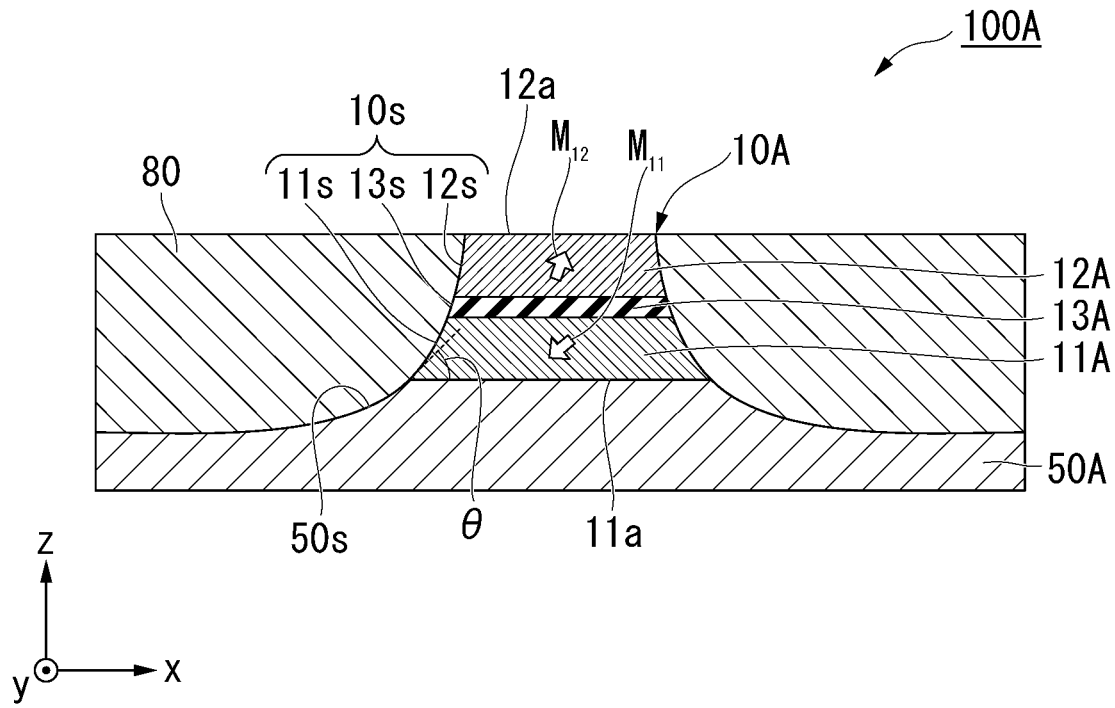
FIG. 7 is a cross-sectional view schematically showing a modified example of the spin-orbit torque magnetization rotating element according to the first embodiment.
Figure 8:
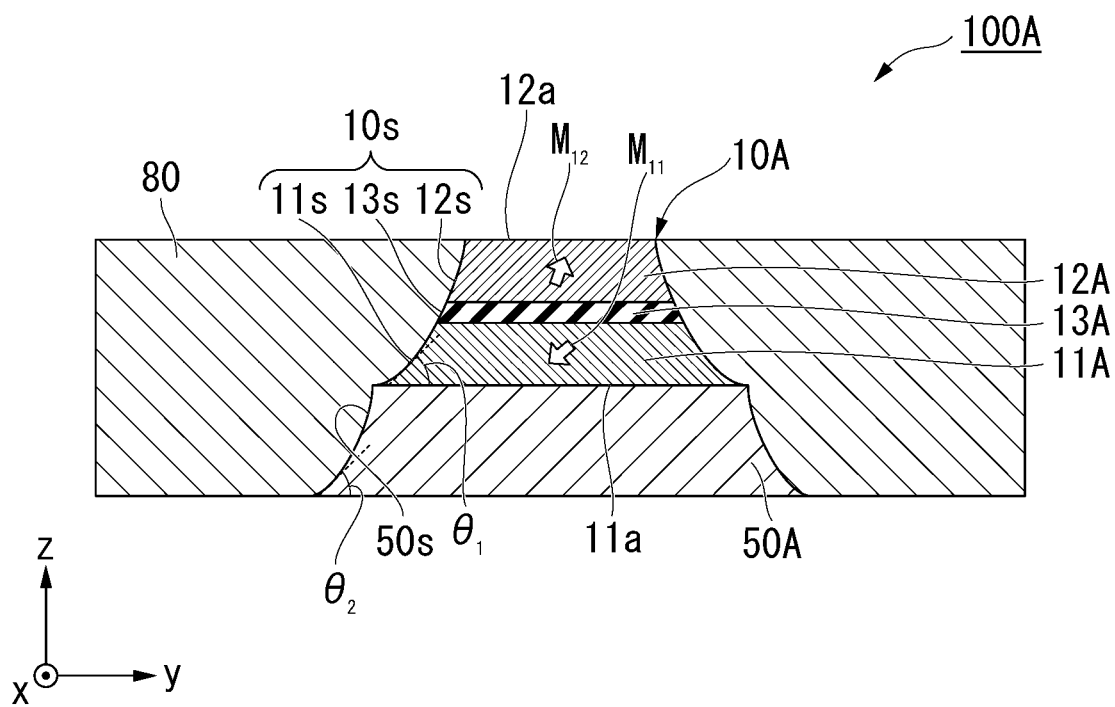
FIG. 8 is a cross-sectional view schematically showing a modified example of the spin-orbit torque magnetization rotating element according to the first embodiment.

FIG. 7 and FIG. 8 are cross-sectional views schematically showing a first modified example of the spin-orbit torque magnetization rotating element according to the first embodiment. FIG. 7 is a cross-sectional view of a spin-orbit torque magnetoresistance effect element 100A cut along the xz plane passing through the center of a spin-orbit torque wiring 50A in the y direction. FIG. 8 is a cross-sectional view of the spin-orbit torque magnetization rotating element 100 cut along the yz plane passing through the center of a first ferromagnetic layer 11A in the x direction.

The first modified example shown in FIG. 7 and FIG. 8 is different from the first embodiment in that side surfaces of a second ferromagnetic layer 12A, a nonmagnetic antiferromagnetic coupling layer 13A, and the first ferromagnetic layer 11A and a part of the spin-orbit torque wiring 50A are curved in the x direction or the y direction with respect to the +z direction. The other components are the same as those in the spin-orbit torque magnetization rotating element 100 according to the first embodiment, the same components are denoted with the same reference numerals and descriptions thereof are omitted.

A side surface 10s of a laminated body 10A is constituted by respective side surfaces 12s, 13s, and 11s of the second ferromagnetic layer 12A, the nonmagnetic antiferromagnetic coupling layer 13A, and the first ferromagnetic layer 11A. The side surface 10s of the laminated body 10A forms one continuous side surface.

"Continuous" means that the inclination of the tangent of the side surface 10s is constant, or changes continuously in the cross-sectional view cut along the xz plane or the yz plane.

As shown in FIG. 7, the spin-orbit torque wiring 50A according to the first modified example is different from the spin-orbit torque wiring 50 according to the first embodiment in that it has an inclined surface 50s in a part thereof. In the cross-sectional view cut along the xz plane, the side surface 10s of the laminated body 10A is continuous with the inclined surface 50s of the spin-orbit torque wiring 50A. As shown in FIG. 8, in the cross-sectional view cut along the yz plane, the side surface 10s of the laminated body 10A is inflected at a junction with respect to the inclined surface 50s of the spin-orbit torque wiring 50A. Therefore, in FIG. 8, the side surface 10s of the laminated body 10A is not continuous with the inclined surface 50s. Processing of the spin-orbit torque wiring 50A in the y direction is performed before the laminated body 10A is laminated, and processing in the x direction is performed simultaneously with the laminated body 10A.

The area of a first surface 12a of the second ferromagnetic layer 12A of the first modified example is smaller than that of a first surface 11a of the first ferromagnetic layer 11A. The first surface 12a of the first modified example is a surface positioned at the highest position in the +z direction among layers constituting the laminated body 10A. The first surface 11a of the first modified example is a surface positioned at the lowest position in the −z direction among layers constituting the laminated body 10A.

When viewed in the z direction, the laminated body 10A shown in FIG. 7 and FIG. 8 extends in the xy plane toward the spin-orbit torque wiring 50A. When viewed in the z direction, the outer peripheral length or the outer diameter of the laminated body 10A increases toward the spin-orbit torque wiring 50A. In addition, when viewed in the x direction or the y direction, the side surface 10s of the laminated body 10A is inclined with respect to the xy plane. An inclination angle $\theta_1$ of the side surface 10s with respect to the xy plane may vary or be constant depending on the position of the height in the z direction (that is, the side surfaces 12s, 13s, and 11s constituting the side surface 10s). The inclination angle $\theta_1$ of the side surface 10s with respect to the xy plane decreases, for example, toward the spin-orbit torque wiring 50A.

The side surface 10s of the laminated body 10A and the inclined surface 50s of the spin-orbit torque wiring 50 of the first modified example are inclined with respect to the xy plane. For example, an inclination angle $\theta_1$ of the side surface 10s and an inclination angle $\theta_2$ of the inclined surface 50s are different from each other.

FIG. 7 and FIG. 8 both show an insulating layer 80 surrounding the periphery of the laminated body 10A and the spin-orbit torque wiring 50A. The insulating layer 80 is an insulating layer that insulates between wirings of the multi-layer wiring or between elements. The insulating layer 80 is made of, for example, silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), or zirconium oxide ($ZrO_x$).

As in the first embodiment, the magnetization of the spin-orbit torque magnetization rotating element 100A according to the first modified example can easily be inverted, and it has excellent thermal stability.

As in the first embodiment, the magnetization of the spin-orbit torque magnetization rotating element 100A according to the first modified example can easily be inverted, and it has excellent thermal stability. Since the magnetization of the spin-orbit torque magnetization rotating element 100A according to the first modified example has the side surfaces 11s of the first ferromagnetic layer 11A is inclined with respect to the xy plane, the inversion current density can be reduced further. Since the inversion current value is proportional to the film thickness of the first ferromagnetic layer A, the magnetization reversal is initiated at the inclined end portion of the first ferromagnetic layer 11A inclined with respect to the xy plane when viewed from the y direction.

In other words, the magnetization reversal in the first ferromagnetic layer 11A sequentially occurs from the first end to the second end in the x direction. The propagation of the magnetization reversal from the first end of the first ferromagnetic layer 11A (the laminated body 10A) to the second end of the first ferromagnetic layer 11A (the laminated body 10A) in the x direction is similar to the principle of domain wall movement. When the magnetization reversal of the first ferromagnetic layer 11A occurs at random positions in the plane of the first ferromagnetic layer 11A, twisted states of the magnetization occur at multiple locations in the first ferromagnetic layer 11A. The twisted state of magnetization is a state in which adjacent magnetizations are oriented in different directions. Contrary to that, when magnetization reversal occurs sequentially from the first end of the first ferromagnetic layer 11A (the laminated body 10A) to the second end of the first ferromagnetic layer 11A (the laminated body 10A) in the x direction, the number of places where magnetization twisting occurs is reduced, the magnetization reversal becomes smooth, and the switching current density can be reduced.

Further, as shown in FIG. 8, in the spin orbit torque type magnetization rotation device 100A according to the first modification, a portion of the spin-orbit torque wiring 50A is curved in the current perpendicular direction (the y direction) with respect to the +z direction. Under the influence of the other layers, the state of the crystal differs between the curved portion and the non-curved portion of the spin-orbit torque wiring 50A. The crystal lattice of the spin-orbit torque wiring 50A is distorted in the z direction in which crystals are connected with other layers. As a result, the spin-orbit torque wiring 50A has an asymmetric structure, and can generate spin current more efficiently.

"Second Modified Example"

Figure 9:
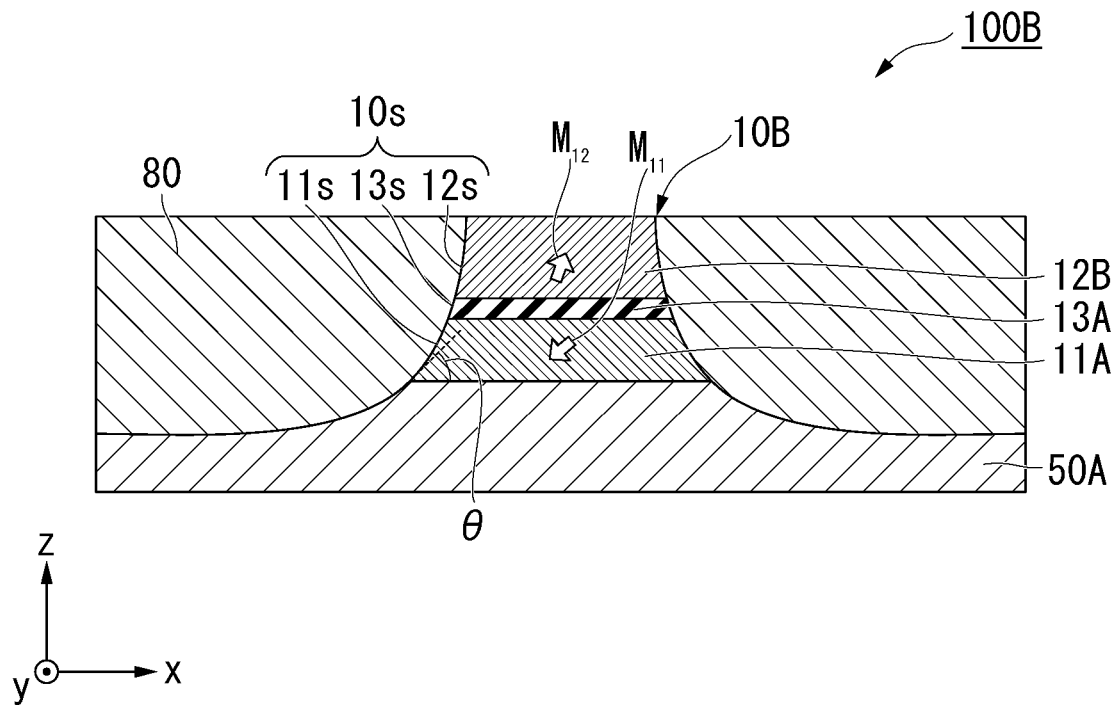
FIG. 9 is a cross-sectional view schematically showing a modified example of the spin-orbit torque magnetization rotating element according to the first embodiment.

FIG. 9 is a cross-sectional view schematically showing a second modified example of the spin-orbit torque magnetization rotating element according to the first embodiment. The second modified example is different from the first modified example in that the film thickness of a second ferromagnetic layer 12B is thicker than the film thickness of the first ferromagnetic layer 11A. The other components are the same as those in the spin-orbit torque magnetization rotating element 100A according to the first modified example, the same components are denoted with the same reference numerals and descriptions thereof are omitted.

The film thickness of the second ferromagnetic layer 12B according to the second modified example is thicker than the film thickness of the first ferromagnetic layer 11A. The area of the second ferromagnetic layer 12B when viewed in a plan view in the z direction is smaller than the area of the first ferromagnetic layer 11A. When the film thickness of the second ferromagnetic layer 12B is thicker than the film thickness of the first ferromagnetic layer 11A, a volume difference between the second ferromagnetic layer 12B and the first ferromagnetic layer 11A can be reduced. The volume of the second ferromagnetic layer 12B and the volume of the first ferromagnetic layer 11A are, for example, substantially the same, and preferably the same. "Substantially the same" means that the other side is within a variation range of 10% with respect to one side. In the cross-sectional view cut along the xz plane, the area of the second ferromagnetic layer 12B and the area of the first ferromagnetic layer 11A are substantially the same, and/or in the cross-sectional view cut along the yz plane, the area of the second ferromagnetic layer 12B and the area of the first ferromagnetic layer 11A are substantially the same.

As in the first embodiment, the magnetization of a spin-orbit torque magnetization rotating element 100B according to the second modified example can easily be inverted and it has excellent thermal stability. When the spin-orbit torque magnetization rotating element 100B according to the second modified example has the above configuration, since the strength of the magnetic field becomes the same, a generated amount of a leakage magnetic field can be reduced, and a synthetic antiferromagnetic structure (SAF structure) in which a laminated body 10B becomes more stable is obtained.

"Third Modified Example"

Figure 10:
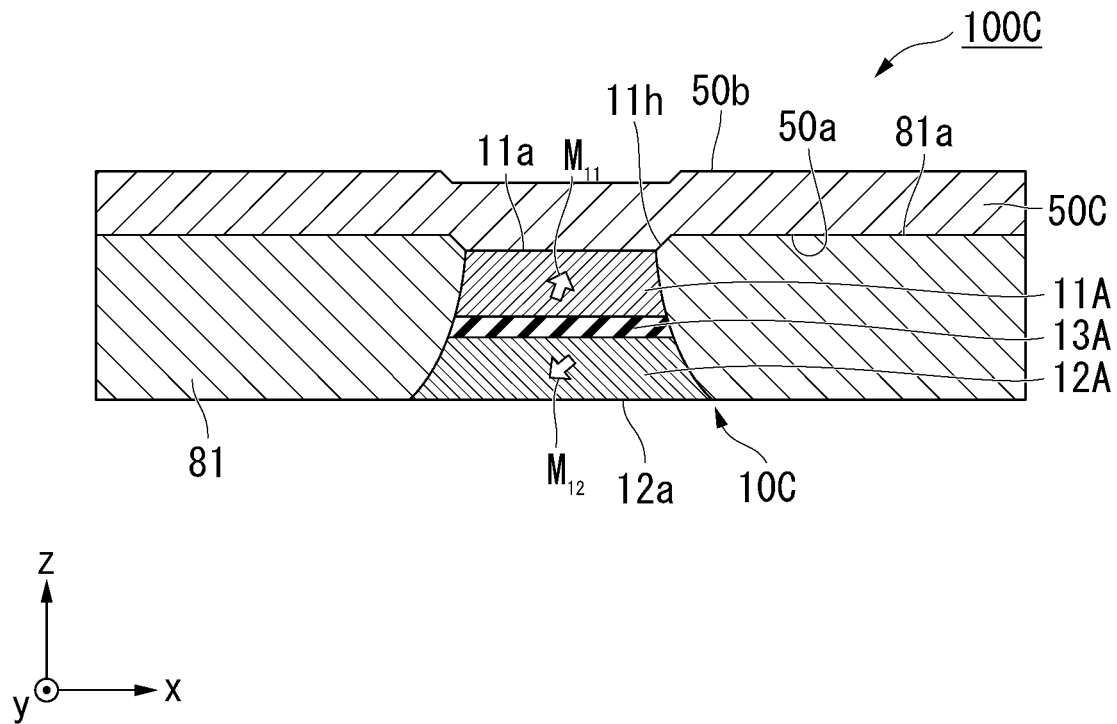
FIG. 10 is a cross-sectional view schematically showing a modified example of the spin-orbit torque magnetization rotating element according to the first embodiment.

FIG. 10 is a cross-sectional view schematically showing a third modified example of the spin-orbit torque magnetization rotating element according to the first embodiment. The third modified example shown in FIG. 10 is different from the first modified example in that a positional relationship between a laminated body 10C and a spin-orbit torque wiring 50C is reversed. The other components are the same as those in the spin-orbit torque magnetization rotating element 100A according to the first modified example, the same components are denoted with the same reference numerals and descriptions thereof are omitted.

In the third modified example shown in FIG. 10, the spin-orbit torque wiring 50C is positioned in the +z direction of the laminated body 10A. When a third ferromagnetic layer 40 (refer to FIG. 11) to be described below is applied to a spin-orbit torque magnetization rotating element 100C, the third ferromagnetic layer 40 is positioned on the side of a substrate Sub to be described below with respect to the laminated body 10C. The spin-orbit torque magnetization rotating element 100C according to the third modified example has a bottom pin structure when the third ferromagnetic layer 40 is laminated. The first surface 11a of the first ferromagnetic layer 11 according to the third modified example is positioned at the highest position in the +z direction among layers constituting the laminated body 10C. The first surface 12a of the second ferromagnetic layer 12 according to the third modified example is positioned at the lowest position in the −z direction among layers constituting the laminated body 10C. A positional relationship between the first surface 11a and the first surface 12a is inverted to that of the first modified example. The area of the first surface 11a of the first ferromagnetic layer 11 is smaller than that of the first surface 12a of the second ferromagnetic layer 12.

The spin-orbit torque wiring 50C of the third modified example is recessed in the −z direction at a part overlapping the first surface 11a of the first ferromagnetic layer 11 in the z direction.

A part of a first surface 50a of the spin-orbit torque wiring 50C of the third modified example not overlapping the first surface 11a is positioned in the +z direction relative to the first surface 11a. The first surface 50a is a surface on the side of the laminated body 10C of the spin-orbit torque wiring 50C. The first surface 50 is recessed in the −z direction at a position overlapping the first surface 11a. The change in the height position of the first surface 50a in the z direction is caused due to, for example, a difference in the polishing speed when surfaces of an insulating layer 81 and the first ferromagnetic layer 11A are subjected to chemical mechanical polishing (CMP).

A second surface 50b of the spin-orbit torque wiring 50C of the third modified example is not flat, and is recessed in the −z direction at a part overlapping the first surface 11a of the first ferromagnetic layer 11 in the z direction. The second surface 50b is a surface opposite to the first surface 50a. The change in the height position of the second surface 50b in the z direction is caused when the second surface 50b reflects the shape of the first surface 50a. The film thickness of the spin-orbit torque wiring 50C is, for example, substantially constant at respective positions in the x direction.

The insulating layer 81 shown in FIG. 10 covers the periphery of the laminated body 10C. A first surface 81a of the insulating layer 81 is positioned in the +z direction relative to the first surface 11a. For example, the first surface 81a becomes higher in the +z direction away from an end 11h of the first surface 11a.

The spin-orbit torque magnetization rotating element 100C according to the third modified example has a positional relationship between the laminated body 10C and the spin-orbit torque wiring 50C different from that of the first embodiment, but the magnetization can easily be inverted and it has excellent thermal stability as in the first embodiment.

The first modified example to the third modified example can also be applied to the second embodiment.

For example, the first embodiment and the second embodiment illustrate an example in which the axis of easy magnetization is a combination of a magnetic film in the orthogonal direction and a magnetic film in the in-plane direction. The present invention is not limited to this case, and there may be a configuration in which the first ferromagnetic layer and the second ferromagnetic layer are both in the in-plane direction or the orthogonal direction. The direction of the axis of easy magnetization (first direction) of the first ferromagnetic layer independently and the direction of the axis of easy magnetization (second direction) of the second ferromagnetic layer independently may cross, and thus the magnetization direction of the first ferromagnetic layer is inclined with respect to the injected first spin S1 and the symmetry of the magnetization $M_{21}$ of the first ferromagnetic layer 21 is broken. Therefore, magnetization reversal under no magnetic field is possible.

The spin-orbit torque magnetization rotating elements according to the above embodiments can be applied to a nonvolatile random access memory (MRAM), a high-frequency component, a magnetic sensor, and the like, and for example, can be used as a magnetic anisotropy sensor and an optical element using a magnetic Kerr effect or a magnetic Faraday effect.

(Spin-orbit Torque Magnetoresistance Effect Element)
"Third Embodiment"

Figure 11:
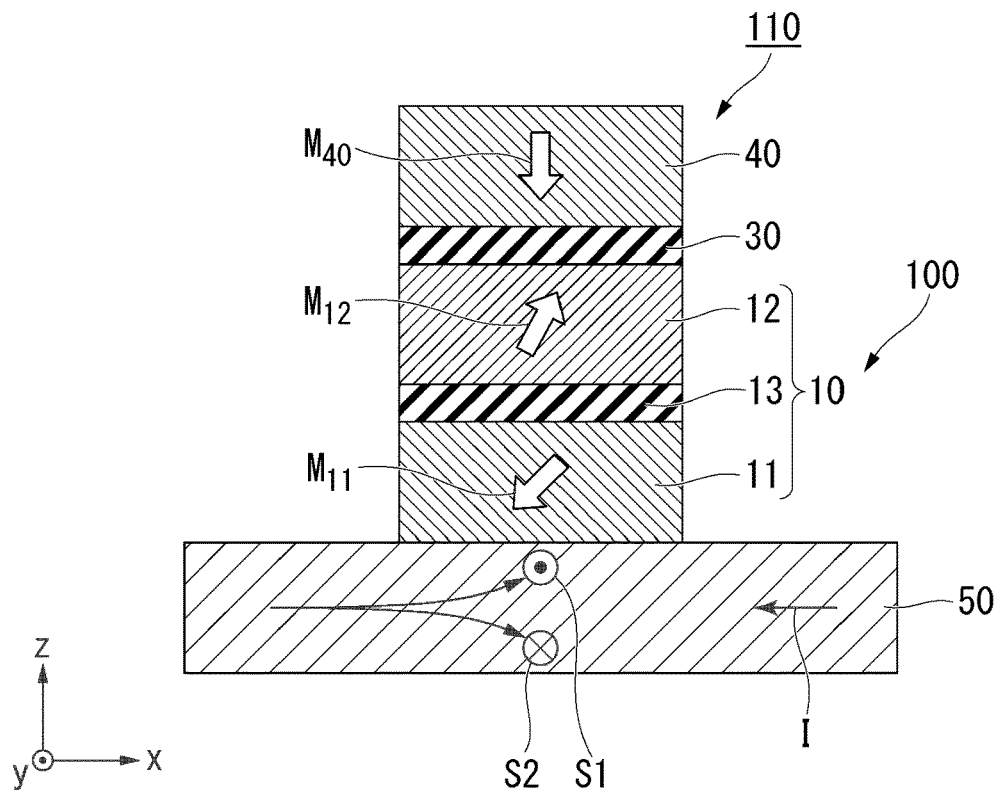
FIG. 11 is a schematic cross-sectional view of a spin-orbit torque magnetoresistance effect element according to a third embodiment.

FIG. 11 is a schematic cross-sectional view of a spin-orbit torque magnetoresistance effect element 110 according to a third embodiment. The spin-orbit torque magnetoresistance effect element 110 shown in FIG. 11 includes the spin-orbit torque magnetization rotating element 100 according to the first embodiment, a nonmagnetic layer 30, and the third ferromagnetic layer 40. Description of the same components as in the spin-orbit torque magnetization rotating element 100 of the first embodiment will be omitted.

A functional part in which the laminated body 10, the nonmagnetic layer 30, and the third ferromagnetic layer 40 are laminated functions in the same manner as in a general magnetoresistance effect element. The functional part functions when a magnetization $M_{40}$ of the third ferromagnetic layer 40 is fixed in one direction (z direction) and the direction of the magnetization $M_{12}$ of the second ferromagnetic layer 12 relatively changes. In application to a coercivity-differed type (pseudo spin valve type) MRAM, the coercivity of the third ferromagnetic layer 40 is larger than the coercivity of the second ferromagnetic layer 12. In application to an exchange bias type (spin valve; spin valve type) MRAM, the magnetization $M_{40}$ of the third ferromagnetic layer 40 is fixed by exchange coupling with the antiferromagnetic layer.

In addition, in the functional part, when the nonmagnetic layer 30 is made of an insulator, the functional part has the same configuration as a tunneling magnetoresistance (TMR) element, and when the functional part is made of a metal, it has the same configuration as the giant magnetoresistance (GMR) element.

Regarding a laminated bodyd structure of the functional part, a laminated bodyd structure of a known magnetoresistance effect element can be used. For example, each layer may be composed of a plurality of layers, and may have another layer such as an antiferromagnetic layer for fixing the direction of the magnetization of the third ferromagnetic layer 40. The third ferromagnetic layer 40 corresponds to a fixed layer or a reference layer, and the laminated body 10 corresponds to a free layer, a storage layer, or the like.

Regarding the material of the third ferromagnetic layer 40, a known material can be used. For example, a metal selected from a group consisting of Cr, Mn, Co, Fe and Ni and an alloy containing one or more of such a metal and exhibiting ferromagnetism can be used. An alloy containing such a metal and at least one element of B, C, and N can be used. Specifically, Co—Fe and Co—Fe—B may be exemplified.

In addition, for the third ferromagnetic layer 40, a Heusler alloy such as $Co_2FeSi$ may be used. When a Heusler alloy is used, a functional part can output a higher MR ratio. A Heusler alloy contains an intermetallic compound having a chemical composition of XYZ or $X_2YZ$. In the periodic table, X is a transition metal element from the Co, Fe, Ni, or Cu groups or a noble metal element, Y is a transition metal from the Mn, V, Cr or Ti groups or an element of type X, and Z is a typical element from Group III to Group V. For example, $Co_2FeSi$, $Co_2MnSi$ and $Co_2Mn_{1-a}Fe_aAl_bSi_{1-b}$ may be exemplified.

In order to further increase the coercivity with respect to the laminated body 10 of the third ferromagnetic layer 40, an antiferromagnetic material such as IrMn or PtMn may be used as a material in contact with the third ferromagnetic layer 40. In addition, in order to prevent a leakage magnetic field of the third ferromagnetic layer 40 from influencing the laminated body 10, a synthetic ferromagnetic coupling structure may be used.

A known material can be used for the nonmagnetic layer 30.

For example, when the nonmagnetic layer 30 is made of an insulator (when it is a tunnel barrier layer), $Al_2O_3$, $SiO_2$, MgO, $MgAl_2O_4$, or the like can be used as the material. In addition to these, materials in which some of Al, Si, and Mg are substituted with Zn, Be or the like can be used. Among these, since MgO and $MgAl_2O_4$ are materials that can realize coherent tunneling, spins can be injected efficiently. When the nonmagnetic layer 30 is made of a metal, Cu, Au, Ag, or the like can be used as the material. In addition, when the nonmagnetic layer 30 is made of a semiconductor, Si, Ge, $CuInSe_2$, $CuGaSe_2$, Cu (In, Ga)$Se_2$ or the like can be used as the material.

The functional part may have other layers. For example, an underlayer may be provided between the laminated body 10 and the spin-orbit torque wiring 50, and a cap layer may be provided on a surface opposite to the nonmagnetic layer 30 of the third ferromagnetic layer 40.

When a layer is disposed between the spin-orbit torque wiring 50 and the first ferromagnetic layer 11, it is preferable to prevent spins propagated from the spin-orbit torque wiring 50 from dissipating. It is known that, for example, silver, copper, magnesium and aluminum have long spin diffusion lengths of 100 nm or more and are unlikely to dissipate spins. In addition, preferably, the thickness of the layer is equal to or less than the spin diffusion length of a substance constituting the layer. When the thickness of the layer is equal to or less than the spin diffusion length, spins propagating from the spin-orbit torque wiring 50 can be sufficiently transmitted to the first ferromagnetic layer 11.

In the spin-orbit torque magnetoresistance effect element 110 according to the third embodiment, data is recorded and read using the change in the resistance value of the functional part caused by a difference in the relative angle formed by the magnetization $M_{12}$ of the second ferromagnetic layer 12 and the magnetization $M_{40}$ of the third ferromagnetic layer 40.

In the spin-orbit torque magnetoresistance effect element 110 according to the third embodiment, the axis of easy magnetization of the third ferromagnetic layer 40 is the same as the axis of easy magnetization of the second ferromagnetic layer 12 independently. In this case, it is preferable to make magnetic anisotropy of the second ferromagnetic layer 12 stronger than magnetic anisotropy of the first ferromagnetic layer 11. Since the magnetization $M_{12}$ of the second ferromagnetic layer 12 is not largely inclined from the z direction, the MR ratio of the spin-orbit torque magnetoresistance effect element 110 can be increased.

Also in the spin-orbit torque magnetoresistance effect element 110 according to the third embodiment, magnetization reversal under no magnetic field is possible.

"Fourth Embodiment"

Figure 12:
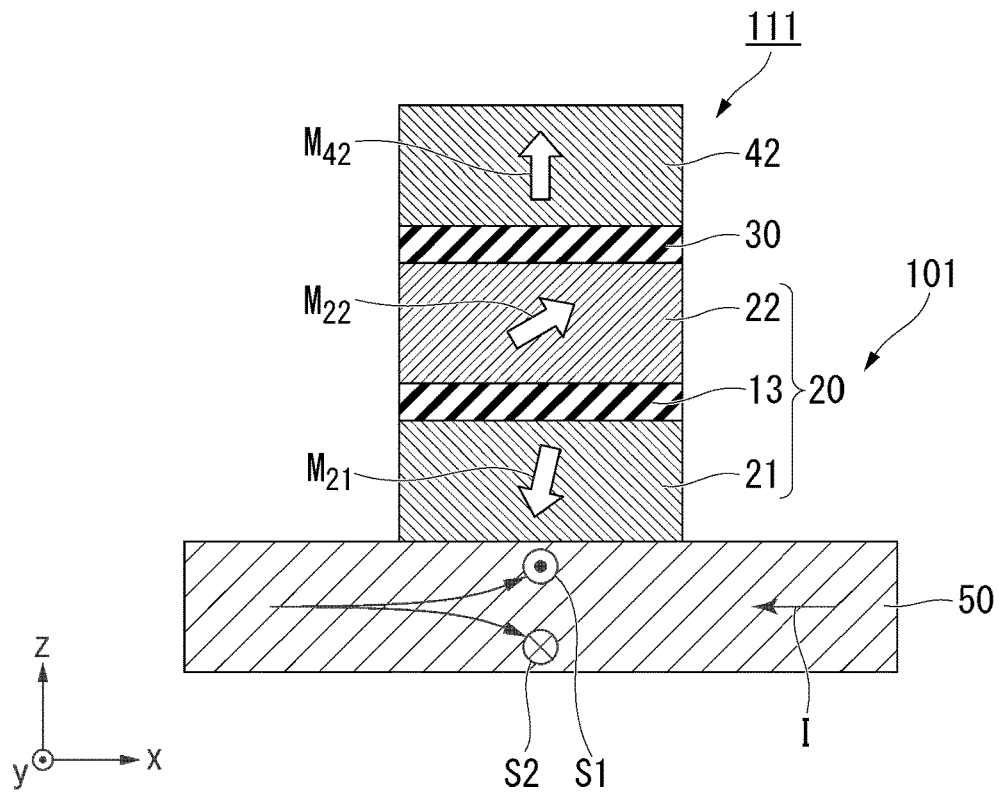
FIG. 12 is a schematic cross-sectional view of a spin-orbit torque magnetoresistance effect element according to a fourth embodiment.

FIG. 12 is a schematic cross-sectional view of a spin-orbit torque magnetoresistance effect element 111 according to a fourth embodiment. The spin-orbit torque magnetoresistance effect element 111 shown in FIG. 12 includes the spin-orbit torque magnetization rotating element 101 according to the second embodiment, the nonmagnetic layer 30, and a third ferromagnetic layer 42. This element is different from the spin-orbit torque magnetoresistance effect element 110 according to the third embodiment in that the spin-orbit torque magnetization rotating element 101 according to the second embodiment is used, and an orientation direction of a magnetization $M_{42}$ of the third ferromagnetic layer 42 is different.

As in the spin-orbit torque magnetoresistance effect element 110 according to the third embodiment, in the spin-orbit torque magnetoresistance effect element 111 according to the fourth embodiment, data is recorded and read using the change in the resistance value of the functional part caused by a difference in the relative angle formed by the magnetization $M_{12}$ of the second ferromagnetic layer 12 and the magnetization $M_{42}$ of the third ferromagnetic layer 42.

In the spin-orbit torque magnetoresistance effect element 111 according to the fourth embodiment, the axis of easy magnetization of the third ferromagnetic layer 42 is the same as the axis of easy magnetization of the second ferromagnetic layer 12 independently. In this case, it is preferable to make magnetic anisotropy of the second ferromagnetic layer 12 stronger than magnetic anisotropy of the first ferromagnetic layer 11. Since the magnetization $M_{12}$ of the second ferromagnetic layer 12 is not largely inclined from the in-plane direction, the MR ratio of the spin-orbit torque magnetoresistance effect element 111 can be increased.

Also in the spin-orbit torque magnetoresistance effect element 111 according to the fourth embodiment, magnetization reversal under no magnetic field is possible.

"Fifth Embodiment"

<Magnetic Memory>

Figure 13:
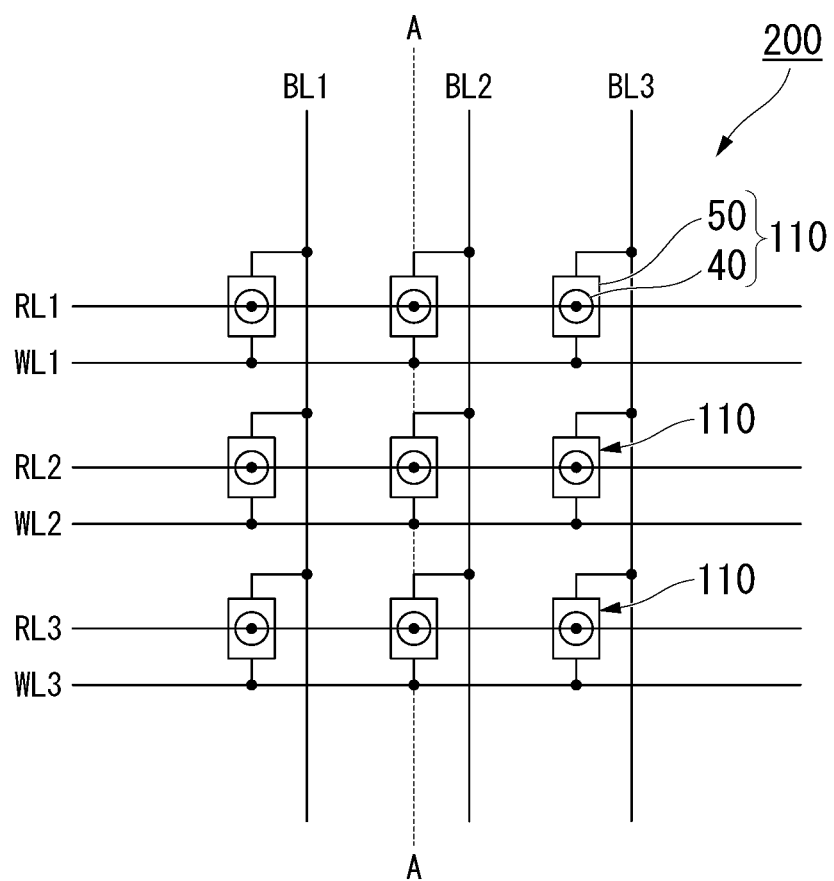
FIG. 13 is a schematic view of a magnetic memory according to a fifth embodiment.

FIG. 13 is a plan view of a magnetic memory 200 including the plurality of spin-orbit torque magnetoresistance effect elements 110 (refer to FIG. 11). The magnetic memory 200 shown in FIG. 13 has a 3×3 matrix arrangement of the spin-orbit torque magnetoresistance effect element 110. FIG. 13 shows an example of a magnetic memory, and the number and arrangement of spin-orbit torque magnetoresistance effect elements 110 are arbitrary, and the spin-orbit torque magnetoresistance effect element 111 according to the fourth embodiment may be used.

One word line WL1 to WL3, one bit line BL1 to BL3, one lead line RL1 to RL3 are connected to the spin-orbit torque magnetoresistance effect element 110.

When the word lines WL1 to WL3 and the bit lines BL1 to BL3 to which a current is applied are selected, a current flows to the spin-orbit torque wiring 50 of the arbitrary spin-orbit torque magnetoresistance effect element 110 to perform a write operation. In addition, when the lead lines RL1 to RL3 and the bit lines BL1 to BL3 to which a current is applied are selected, a current flows in the lamination direction of the arbitrary spin-orbit torque magnetoresistance effect element 110 to perform a read operation. The word lines WL1 to WL3, the bit lines BL1 to BL3, and the lead lines RL1 to RL3 to which a current is applied can be selected by a transistor or the like. That is, data of an arbitrary element from among the plurality of spin-orbit torque magnetoresistance effect elements 110 is read and thus can be used for a magnetic memory.

Figure 14:
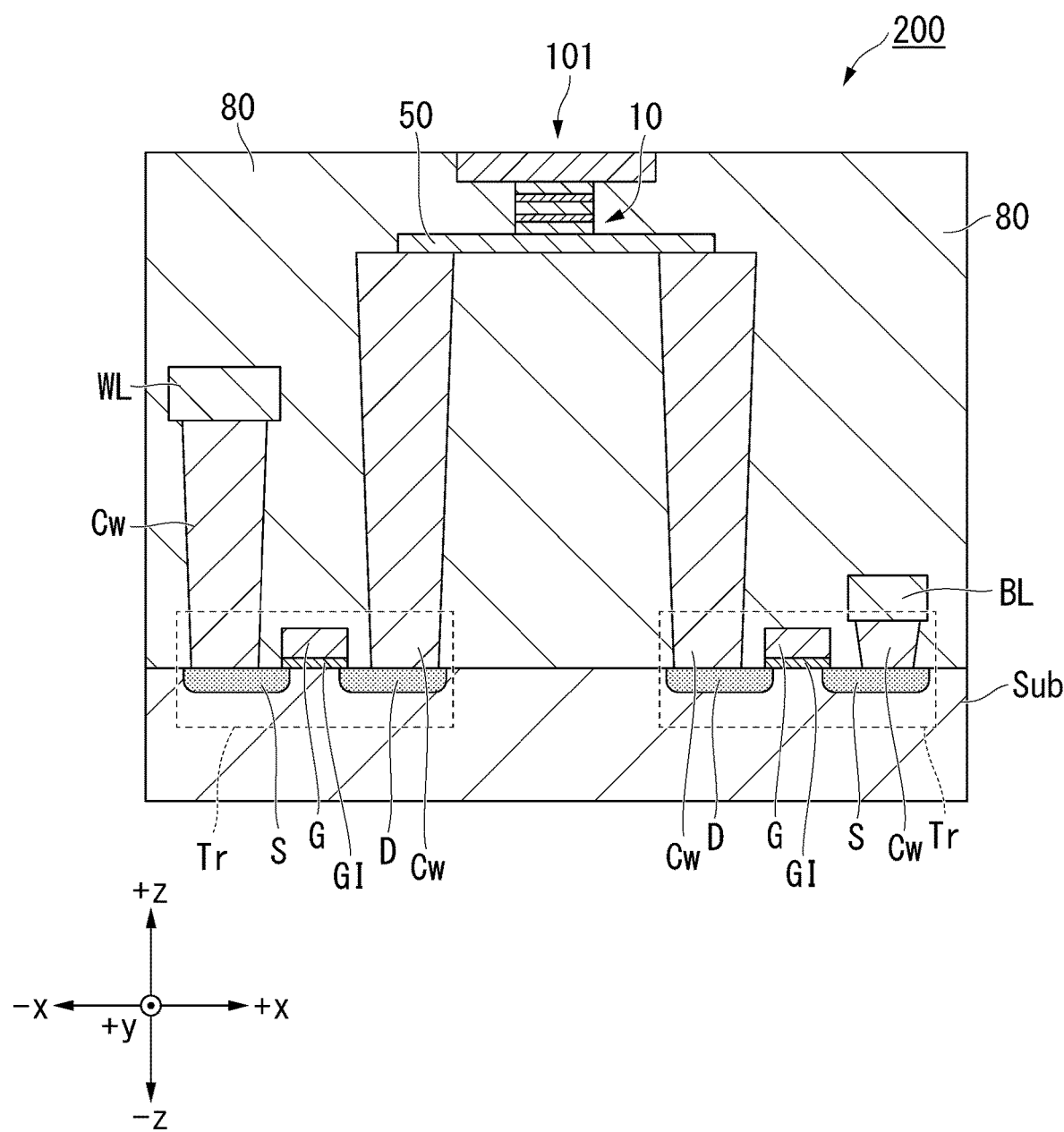
FIG. 14 is a cross-sectional view of the magnetic memory according to the fifth embodiment cut along an A-A' plane.

FIG. 14 is a cross-sectional view of the magnetic memory 200 according to the fifth embodiment in FIG. 13 cut along the A-A' plane. The semiconductor device 200 includes the spin-orbit torque magnetoresistance effect element 110 and the plurality of switching elements connected to the spin-orbit torque magnetoresistance effect element 110. Among the plurality of switching elements, some of the switching elements do not present on the cross section shown in FIG. 14, and for example, are positioned in the paper depth direction (-y direction).

The switching element is a transistor Tr shown in FIG. 14. The transistor Tr includes a gate electrode G, a gate insulating film GI, and a source area S and a drain area D formed on the substrate Sub. The substrate Sub is, for example, a semiconductor substrate.

Each of the transistors Tr and the spin-orbit torque magnetoresistance effect element 110 are electrically connected via a conductive part Cw. The conductive part Cw may be referred to as, for example, a connection wiring or a via wiring. The conductive part Cw contains a material having conductivity. The conductive part Cw extends in the z direction.

The spin-orbit torque magnetoresistance effect element 110 and the transistor Tr are electrically separated by the insulating layer 80 except for the conductive part Cw.

The magnetic memory 200 according to the fifth embodiment includes a plurality of spin-orbit torque magnetoresistance effect elements according to the fourth embodiment. Therefore, the magnetic memory 200 can easily rewrite (invert magnetization) data and has excellent power consumption. In addition, the magnetic memory 200 has excellent thermal stability and also has excellent data reliability.

While exemplary embodiments of the present invention have been described above in detail, the present invention is not limited to these specific embodiments, and various modifications and alternations can be made in a range within the spirit and scope of the present invention described in the scope of the claims.

In the spin-orbit torque magnetization rotating element, the spin-orbit torque magnetoresistance effect element, and the magnetic memory according to the above aspects, the direction of magnetization can be inverted even if no external magnetic field is applied.

EXPLANATION OF REFERENCES 10, 10A, 10B, 10C Laminate
11, 11A, 21 First ferromagnetic layer
12, 12A, 22 Second ferromagnetic layer
13, 13A Antiferromagnetic coupling layer
30 Nonmagnetic layer
40, 42 Third ferromagnetic layer
50, 50A, 50C Spin-orbit torque wiring
100, 100A, 100B, 100C, 101 Spin-orbit torque magnetization rotating element
110, 111 Spin-orbit torque magnetoresistance effect element
200 Magnetic memory
$M_{11}$, $M_{12}$, $M_{21}$, $M_{22}$, $M_{40}$, $M_{42}$ Magnetization
S1 First spin
S2 Second spin

What is claimed is:

1. A spin-orbit torque magnetization rotating element, comprising:
    a spin-orbit torque wiring; and
    a laminated body laminated on the spin-orbit torque wiring,
    wherein the laminated body includes a first ferromagnetic layer independently having an axis of easy magnetization in a first direction, a nonmagnetic antiferromagnetic coupling layer, and a second ferromagnetic layer independently having an axis of easy magnetization in a second direction, in order from the side of the spin-orbit torque wiring, and
    wherein the first direction crosses the second direction.

2. The spin-orbit torque magnetization rotating element according to claim 1,
    wherein the first direction is orthogonal to the second direction.

3. The spin-orbit torque magnetization rotating element according to claim 1,
    wherein the first direction is an in-plane direction of the laminated body, and the second direction is an orthogonal direction of the laminated body.

4. The spin-orbit torque magnetization rotating element according to claim 2,
    wherein the first direction is an in-plane direction of the laminated body, and the second direction is an orthogonal direction of the laminated body.

5. The spin-orbit torque magnetization rotating element according to claim 1,
    wherein the first direction is an orthogonal direction of the laminated body, and the second direction is an in-plane direction of the laminated body.

6. The spin-orbit torque magnetization rotating element according to claim 2,
    wherein the first direction is an orthogonal direction of the laminated body, and the second direction is an in-plane direction of the laminated body.

7. The spin-orbit torque magnetization rotating element according to claim 3,
    wherein the second ferromagnetic layer contains Fe.

8. The spin-orbit torque magnetization rotating element according to claim 4,
    wherein the second ferromagnetic layer contains Fe.

9. The spin-orbit torque magnetization rotating element according to claim 5,
    wherein the first ferromagnetic layer contains Co.

10. The spin-orbit torque magnetization rotating element according to claim 3,
    wherein a film thickness of a ferromagnetic layer having an axis of easy magnetization in an orthogonal direction among the first ferromagnetic layer and the second ferromagnetic layer is thinner than the film thickness of a ferromagnetic layer having an axis of easy magnetization in an in-plane direction.

11. The spin-orbit torque magnetization rotating element according to claim 1,
    wherein a film thickness of the second ferromagnetic layer is thicker than a film thickness of the first ferromagnetic layer.

12. The spin-orbit torque magnetization rotating element according to claim 1,
    wherein the nonmagnetic antiferromagnetic coupling layer contains at least one selected from a group consisting of Ru, Ir, and Rh.

13. The spin-orbit torque magnetization rotating element according to claim 1,
    wherein the laminated body is circular in a plan view.

14. The spin-orbit torque magnetization rotating element according to claim 1,
    wherein the laminated body in a plan view has shape anisotropy with a major axis and a minor axis.

15. A spin-orbit torque magnetoresistance effect element, comprising:
    the spin-orbit torque magnetization rotating element according to claim 1;
    a nonmagnetic layer laminated on a side opposite to the spin-orbit torque wiring of the laminated body; and
    a third ferromagnetic layer with the laminated body and the nonmagnetic layer therebetween.

16. The spin-orbit torque magnetoresistance effect element according to claim 15,
    wherein magnetic anisotropy of a ferromagnetic layer having an axis of easy magnetization in a same direction as the third ferromagnetic layer among the first ferromagnetic layer and the second ferromagnetic layer is stronger than magnetic anisotropy of a ferromagnetic layer having an axis of easy magnetization in a different direction as the third ferromagnetic layer.

17. A magnetic memory comprising a plurality of spin-orbit torque magnetoresistance effect elements according to claim 15.

* * * * *